United States Patent
Zhang et al.

(10) Patent No.: US 10,510,905 B2
(45) Date of Patent: Dec. 17, 2019

(54) POWER SCHOTTKY DIODES HAVING CLOSELY-SPACED DEEP BLOCKING JUNCTIONS IN A HEAVILY-DOPED DRIFT REGION

(71) Applicant: Cree, Inc., Durham, NC (US)

(72) Inventors: Qingchun Zhang, Cary, NC (US); Edward R. Van Brunt, Raleigh, NC (US); Brett Hull, Raleigh, NC (US); Scott Thomas Allen, Apex, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/642,634

(22) Filed: Jul. 6, 2017

(65) Prior Publication Data

US 2019/0013416 A1  Jan. 10, 2019

(51) Int. Cl.
| | |
|---|---|
| *H01L 29/872* | (2006.01) |
| *H01L 29/66* | (2006.01) |
| *H01L 29/06* | (2006.01) |
| *H01L 29/16* | (2006.01) |
| *H01L 29/36* | (2006.01) |

(52) U.S. Cl.
CPC ........ *H01L 29/872* (2013.01); *H01L 29/0619* (2013.01); *H01L 29/1608* (2013.01); *H01L 29/6606* (2013.01); *H01L 29/36* (2013.01)

(58) Field of Classification Search
CPC .................................................... H01L 29/872
See application file for complete search history.

(56) References Cited

U.S. PATENT DOCUMENTS

| | | | |
|---|---|---|---|
| 8,232,558 B2* | 7/2012 | Zhang | H01L 29/0615 257/471 |
| 8,421,179 B2* | 4/2013 | Tung | H01L 29/872 257/475 |
| 8,432,012 B2 | 4/2013 | Zhang et al. | |
| 8,563,986 B2 | 10/2013 | Zhang | |
| 9,202,703 B2 | 12/2015 | Hagleitner et al. | |
| 9,515,199 B2 | 12/2016 | Van Brunt et al. | |
| 9,577,046 B1* | 2/2017 | Hori | H01L 29/1608 |
| 9,929,284 B1* | 3/2018 | Zhang | H01L 29/872 |
| 2003/0057482 A1* | 3/2003 | Harada | H01L 29/66136 257/329 |
| 2013/0062723 A1* | 3/2013 | Henning | H01L 29/8611 257/484 |
| 2015/0028350 A1 | 1/2015 | Suvorov et al. | |
| 2016/0372609 A1* | 12/2016 | Kiyama | H01L 29/872 |
| 2017/0170264 A1* | 6/2017 | Mauder | H01L 27/0629 |

* cited by examiner

*Primary Examiner* — Eugene Lee
(74) *Attorney, Agent, or Firm* — Myers Bigel, P.A.

(57) ABSTRACT

A Schottky diode includes a drift region, a channel in an upper portion of the drift region, and first and second adjacent blocking junctions in the upper portion of the drift region that define the channel therebetween. The drift region and channel are doped with dopants having a first conductivity type, and the first and second blocking junctions doped with dopants having a second conductivity type that is opposite the first conductivity type. The blocking junctions extend at least one micron into the upper portion of the drift region and are spaced apart from each other by less than 3.0 microns.

17 Claims, 6 Drawing Sheets

POWER SCHOTTKY DIODES HAVING CLOSELY-SPACED DEEP BLOCKING JUNCTIONS IN A HEAVILY-DOPED DRIFT REGION

FIELD OF THE INVENTION

The present invention relates to power semiconductor devices and, more particularly, to power Schottky diodes.

BACKGROUND

Power semiconductor devices are used to carry large currents and support high voltages. Power semiconductor devices are typically fabricated from silicon carbide or gallium nitride based semiconductor materials. One widely used power semiconductor device is the Schottky diode.

Power Schottky diodes typically have a vertical structure where the anode contact is formed on a first major surface (e.g., the bottom surface) of a semiconductor layer structure, and the cathode contact is formed on the other major surface (e.g., the top surface). The semiconductor layer structure may or may not include an underlying substrate. Herein, the term "semiconductor layer structure" refers to a structure that includes one or more semiconductor layers such as semiconductor substrates and/or semiconductor epitaxial layers.

A conventional silicon carbide power Schottky diode typically has a silicon carbide substrate having a first conductivity type (e.g., an n-type substrate), on which an epitaxial layer structure having the first conductivity type (e.g., n-type) is formed. This epitaxial layer structure (which may comprise one or more layers) functions as a drift region of the device. The Schottky diode may include an "active region" that is formed on and/or in the drift region and a termination structure that surrounds the active region. The active region acts as a main junction for blocking voltage in the reverse bias direction and providing current flow in the forward bias direction. Typically, a large number of Schottky diodes are formed on a semiconductor wafer. Each Schottky diode may have a "unit cell" structure in which the active region of the device includes a plurality of individual diodes that are disposed in parallel to each other and that together function as a single power Schottky diode. Each power Schottky diode will typically have its own edge termination structure. The edge termination structure may help reduce undesired electric field crowding effects that may occur at the edges of the active region. After the wafer is fully formed and processed, the wafer may be diced to separate the individual edge-terminated power Schottky diodes. The portion of the wafer included in each individually singulated device is called the substrate.

A power Schottky diode is designed to block (in the reverse blocking state) or pass (in the forward operating state) large voltages and/or currents. For example, in the reverse blocking state, a power Schottky diode may be designed to sustain hundreds or thousands of volts of electric potential. However, as the applied reverse voltage approaches or passes the voltage level that the device is designed to block (the reverse breakdown voltage level), non-trivial levels of reverse leakage current may begin to flow through the diode. As the reverse voltage is increased further, the reverse leakage current may increase rapidly, and the diode will enter reverse breakdown and no longer block the reverse voltage. Current leakage can also occur for other reasons, such as electric field crowding at the edges of the active region and/or failure of an edge termination and/or the primary junction of the device. If the reverse voltage on the device is increased past the reverse breakdown voltage to a critical level, the increasing electric field may result in an uncontrollable and undesirable runaway generation of charge carriers within the Schottky diode, leading to a condition known as avalanche breakdown.

For a vertical Schottky diode, the reverse blocking voltage rating is typically determined by the thickness and the doping concentration of the drift region. The reverse blocking voltage rating of the device may be increased by reducing the doping concentration of the drift region and/or by increasing the thickness of the drift region. During the design phase, a desired reverse blocking voltage rating is selected, and then the thickness and doping of the drift region may be chosen based on the desired reverse blocking voltage rating. Since the drift region is the current path for the device in the forward "on" state, the decreased doping concentration and/or increased thickness of the drift region may result in a higher on-state resistance for the device. Thus, there is an inherent tradeoff between the on-state resistance (and hence the forward voltage that will turn the device on) and the reverse blocking voltage.

Figure 1:
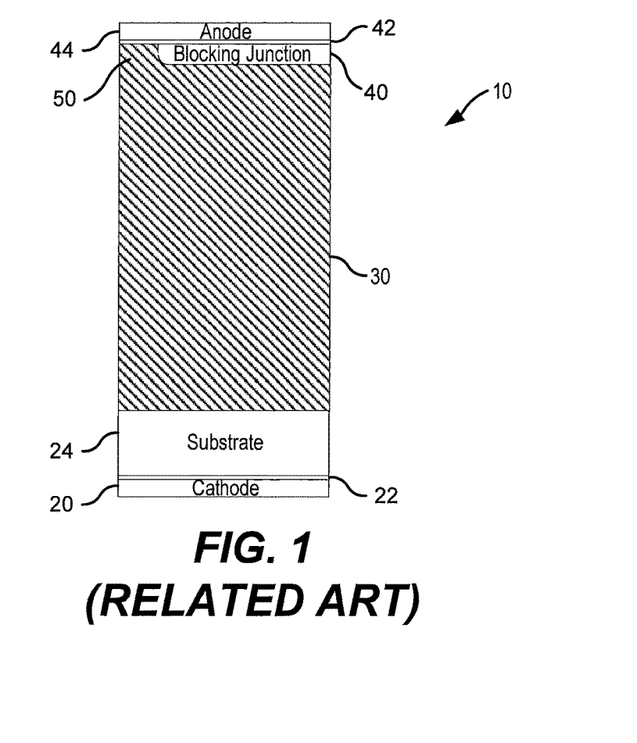
FIG. 1 is a schematic cross-sectional diagram of a conventional power Schottky diode.

FIG. 1 is a schematic cross-sectional diagram of a conventional power Junction Barrier Schottky ("JBS") diode 10. As shown in FIG. 1, the JBS diode 10 includes a cathode contact 20, an ohmic contact layer 22, an n-type substrate 24, an n-type drift region 30, a p-type blocking junction 40, a channel 50 in an upper portion of the n-type drift region, a Schottky contact 42 and an anode contact 44. The cathode contact 20 and the anode contact 44 may each comprise a highly conductive metal layer. The Schottky contact 42 may comprise a layer that forms a Schottky junction with the drift region 30 and may comprise, for example, an aluminum layer. The n-type substrate 24 may comprise a silicon carbide substrate that is heavily doped with n-type impurities such as nitrogen or phosphorous. The ohmic contact layer 22 may comprise a metal that forms an ohmic contact to n-type silicon carbide so as to form an ohmic contact to the silicon carbide substrate 24. The drift region 30 may comprise an epitaxially grown n-type silicon carbide semiconductor region. The p-type blocking junction 40 may be a p-type implanted region in an upper portion of the drift region 30 that is heavily implanted with p-type dopants. The channel 50 may be defined between two adjacent p-type blocking junctions 40 (only one of which is shown in FIG. 1). Current flows through the channel 50 when the diode 10 is in its forward on-state.

SUMMARY

Pursuant to embodiments of the present invention, power Schottky diodes are provided that include a drift region, a channel in an upper portion of the drift region, and first and second adjacent blocking junctions in the upper portion of the drift region that define the channel therebetween. The drift region and channel are doped with dopants having a first conductivity type, and the first and second blocking junctions doped with dopants having a second conductivity type that is opposite the first conductivity type. The blocking junctions extend at least one micron into the upper portion of the drift region and are spaced apart from each other by less than 3.0 microns.

In some embodiments, the Schottky diode further includes a first contact on the upper portion of the drift region and a second contact on the lower portion of the drift region and vertically spaced apart from the first contact.

In some embodiments, a doping concentration of the drift region may be greater than $1.5 \times 10^{16}/cm^3$. In other embodiments, the doping concentration of the drift region may be greater than $2 \times 10^{16}/cm^3$. In some embodiments, the doping concentration of the drift region may be less than $5 \times 10^{16}/cm^3$. In some embodiments, the doping concentration of the drift region may be less than $1 \times 10^{17}/cm^3$.

In some embodiments, the first and second blocking junctions may each have a depth from the upper surface of the drift region of between 1.0 microns and 1.5 microns. In other embodiments, the first and second blocking junctions may each have a depth from the upper surface of the drift region of between 1.0 microns and 2.0 microns. In still other embodiments, the first and second blocking junctions may each have a depth from the upper surface of the drift region of between 1.25 microns and 1.5 microns. In yet other embodiments, the first and second blocking junctions may each have a depth from the upper surface of the drift region of between 1.0 microns and 1.25 microns. The depth of the blocking junctions may refer to the depth at which the blocking junction has a doping density that falls below $1 \times 10^{17}/cm^3$.

In some embodiments, the first and second blocking junctions may each have a doping density of at least $1 \times 10^{17}/cm^3$ at a depth of 1.2 microns from the upper surface of the drift region.

In some embodiments, the first and second blocking junctions may be spaced apart from each other by between 1.0 and 3.0 microns. In further embodiments, these channel widths may be reduced to be below 2.0 microns, or even below 1.5 microns. In some example embodiments, the channel widths may be between 2.0 and 3.0 microns. In other example embodiments, the channel widths may be between 2.0 and 2.5 microns.

In some embodiments, the drift region and the first and second blocking junctions may comprise silicon carbide, and a substrate may be interposed between the lower portion of the drift region and the second contact.

In some embodiments, the Schottky diode may have an area of less than 3 mm², a reverse voltage blocking rating of at least 650 Volts, and a forward voltage of less than 1.7 Volts at 20 Amps forward current at temperatures between 25-175° C. In other embodiments, the Schottky diode may have an area of less than 3 mm², a reverse voltage blocking rating of at least 650 Volts, and a forward voltage of less than 1.9 Volts at 20 Amps forward current at temperatures between 25-175° C. In other embodiments, the Schottky diode may have an area of less than 3 mm², a reverse voltage blocking rating of at least 650 Volts, and a forward voltage of less than 2.1 Volts at 20 Amps forward current at temperatures between 25-175° C.

Pursuant to further embodiments of the present invention, methods of forming a Schottky diode are provided in which a drift region doped with dopants having a first conductivity type is formed, the drift region having a doping concentration of at least $2 \times 10^{16}/cm^3$. Dopant ions having a second conductivity type that is opposite the first conductivity type are implanted into an upper surface of the drift region to form a first blocking junction and a second blocking junction adjacent the first blocking junction, the first and second blocking junctions defining a channel having the first conductivity type therebetween. A first contact is formed on the upper portion of the drift region and a second contact is formed on the lower portion of the drift region and vertically spaced apart from the first contact. The first and second blocking junctions extend at least one micron into the upper portion of the drift region, and the channel has a width of between about 2.0 microns to about 3.0 microns.

DETAILED DESCRIPTION

Figure 2A:
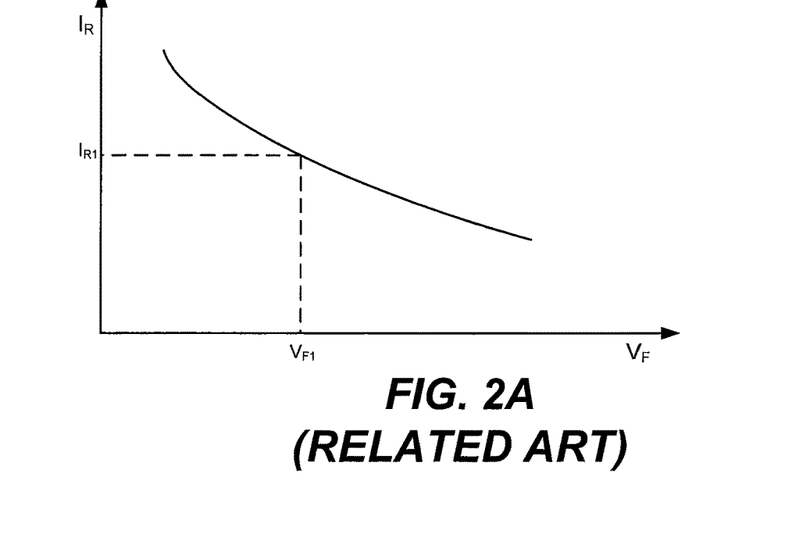
FIG. 2A is a graph illustrating the tradeoff between the forward voltage performance and reverse leakage current performance in a conventional power Schottky diode.

Power Schottky diodes are desired that have a low forward voltage ($V_F$) and the ability to block high voltage levels in the reverse blocking state. As noted above, an inherent tradeoff generally exists between the forward voltage and the reverse leakage current ($I_R$) in a power Schottky diode. This tradeoff is illustrated in FIG. 2A, which is a graph illustrating the $V_F$ versus $I_R$ characteristics faced by a device designer for a conventional power Schottky diode. As illustrated, if the designer has to, for example, maintain the forward voltage below a specified level $Y_{F1}$, then the reverse leakage current level is essentially set at the level $I_{R1}$ by the characteristics of the curve.

In order to provide power Schottky diodes that exhibit both a lower forward voltage and a lower reverse leakage current it is necessary to move the $V_F$-$I_R$ curve of FIG. 2A downwardly and to the left. This is shown schematically in FIG. 2B. As illustrated, if the curve is moved in such a fashion, the forward voltage $V_{F1}$ may be achieved while the reverse leakage current can be reduced below the value $I_{R1}$ to a lower value $I_{R2}$.

Figure 2B:
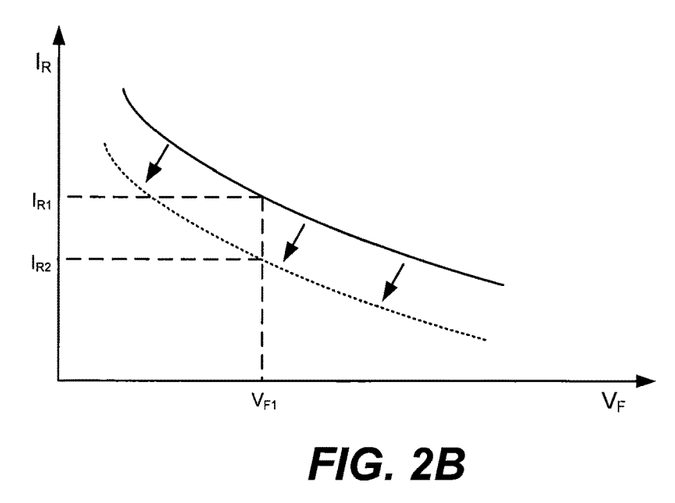
FIG. 2B is a graph illustrating how improved performance may be obtained by shifting the $V_F$-$I_R$ curve of FIG. 2A.

One technique that can be used to move the $V_F$-$I_R$ curve of FIG. 2A downwardly and to the left as shown in FIG. 2B is to use a drift region that has a superjunction structure. A superjunction-type drift region has alternating, side-by-side heavily-doped n-type and p-type regions. The thickness and doping of these regions may be controlled so that the superjunction will act like a p-n junction with low resistance and a high breakdown voltage. The superjunction structure may allow for a more highly doped drift region without a corresponding reduction in the reverse breakdown voltage of the device. However, superjunction drift regions may increase the fabrication cost of the device.

Another technique for reducing the reverse leakage current of a power Schottky diode while maintaining a desired forward voltage level is to increase the doping density of the portion of the drift region in which the channels are formed while reducing the widths of the channels. With reference to FIG. 1, this may be accomplished, for example, by more heavily doping the upper portion of the drift region 30 to form a current spreading layer in the region where the channels 50 are formed prior to formation of the blocking junctions 40. The reduction in the widths of the channels 50 may allow the blocking junctions 40 to more effectively block the electric field in the reverse blocking state, thereby reducing the reverse leakage current, while the increased doping density in the channels 50 may maintain the forward voltage at a desired level.

Unfortunately, however, there are limits to which the channel width may be reduced, as it may become increasingly difficult to form blocking regions 40 and channels 50 therebetween with sufficient accuracy to ensure proper device operation as the channel width is reduced. In particular, the drift region 30 is typically formed via epitaxial growth for manufacturing efficiency. However, when silicon carbide is doped during epitaxial growth variations in doping concentrations of +/−15% are common. After formation of the drift region 30, the oppositely doped blocking junctions 40 are formed by ion implantation using implantation masks that shield the channels 50 during the implantation step. The ion implantation masks are typically formed using a photolithography process. Because the semiconductor substrate 24 may be bowed, portions of the photoresist mask that are over the channels 50 may be exposed to light, and hence variations in the channel widths may be 0.1 micron or more. The variations in doping concentration and channel width may make it difficult to consistently fabricate power Schottky diodes that have small channel widths. Deeper blocking junctions can relax the channel width while maintaining the same peak electric field for mass production with high yield.

Pursuant to embodiments of the present invention, power Schottky diodes are provided that use a combination of more highly doped drift regions and more closely spaced and deeper blocking junctions to provide significantly improved performance. The deeper, more closely spaced blocking junctions may reduce the intensity of the electric field in the upper portion of the drift region during reverse blocking operation, thereby reducing leakage current. However, the reduced spacing between adjacent blocking junctions reduces the widths of the channels, which may increase the forward voltage of the diode. In order to counteract this increase, the doping concentration of the drift region is increased, which acts to reduce the forward voltage. The combination of the more highly-doped drift region, the deeper blocking junctions and the reduced spacing between adjacent blocking junctions provides a significant improvement in device performance, allowing a 25% or more reduction in device size while maintaining a desired reverse blocking voltage rating and forward voltage, and while also achieving improved high temperature performance.

In some embodiments, the drift region may be doped to a concentration of at least $1.5 \times 10^{16}/cm^3$. In other embodiments, the drift region may be doped to a concentration of at least $2 \times 10^{16}/cm^3$, and in still other embodiments, the drift region may be doped to a concentration of at least $5 \times 10^{16}/cm^3$. In each of these embodiments, the blocking junctions may be formed using high energy ion implantation techniques to provide blocking junctions that extend to a depth of at least 1.0 microns from the upper surface of the drift region. In other embodiments, the blocking junctions may extend to a depth of at least 1.2 microns, 1.5 microns or 2.0 microns from the upper surface of a drift region that has any of the above-specified minimum doping concentrations. In some embodiments, the first and second blocking junctions may each have a depth from the upper surface of the drift region of between 1.0 microns and 1.5 microns. In other embodiments, the first and second blocking junctions may each have a depth from the upper surface of the drift region of between 1.0 microns and 2.0 microns. In still other embodiments, the first and second blocking junctions may each have a depth from the upper surface of the drift region of between 1.25 microns and 1.5 microns. In yet other embodiments, the first and second blocking junctions may each have a depth from the upper surface of the drift region of between 1.0 microns and 1.25 microns. In all of the above-described embodiments, adjacent blocking junctions may be laterally spaced apart from each other at distances of less than 3.0 microns to provide channels having widths of no more than 3.0 microns. In further embodiments, these channel widths may be reduced to be below 2.0 microns, or even below 1.5 microns. In some embodiments, the channel widths may be between 2.0 and 3.0 microns. In other embodiments, the channel widths may be between 2.0 and 2.5 microns.

The power Schottky diodes according to embodiments of the present invention may have forward voltage drops with improved temperature coefficients so that the devices exhibit low forward voltage drop levels at both room temperature and at elevated temperatures. These devices may also exhibit low reverse leakage currents during room temperature and high temperature operation. Additionally, the power Schottky diodes according to embodiments of the present invention may be smaller than conventional power Schottky diodes while still meeting desired reverse blocking voltage and current levels. For example, to consistently achieve a reverse blocking voltage level of, for example, 650 Volts. Conventional power Schottky diodes may have, for example, a total area of 4 $mm^2$ or more when the device is viewed in plan view. The power Schottky diodes according to embodiments of the present invention may achieve reverse blocking voltages of at least 650 Volts on a semiconductor chip having a total area of less than 3 $mm^2$, and an active area of less than 2.1 $mm^2$. The improvement in the temperature coefficients of the forward voltage drop and the reduction in chip size may be largely attributed to the higher doping concentration of the drift region. The higher doping concentration in the drift region is made possible by the use of deeper, more closely spaced blocking junctions that protect the Schottky contact from high electric fields during reverse bias operation.

Example embodiments of the present invention will now be described with reference to FIGS. 3A-8. It will be appreciated that features of the different embodiments disclosed herein may be combined in any way to provide additional embodiments.

Figure 3A:
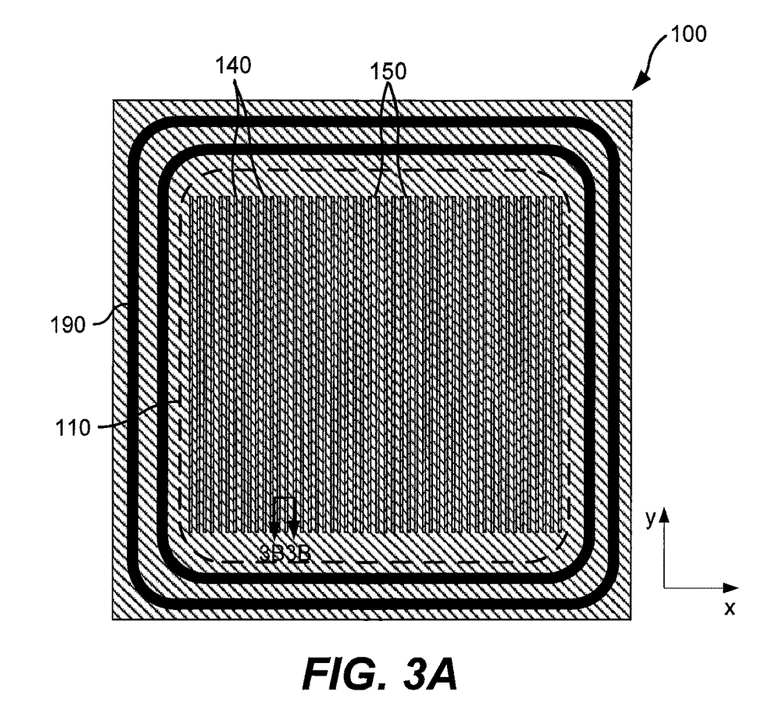
FIG. 3A is a schematic plan view of a power Schottky diode according to certain embodiments of the present invention.
Figure 3B:
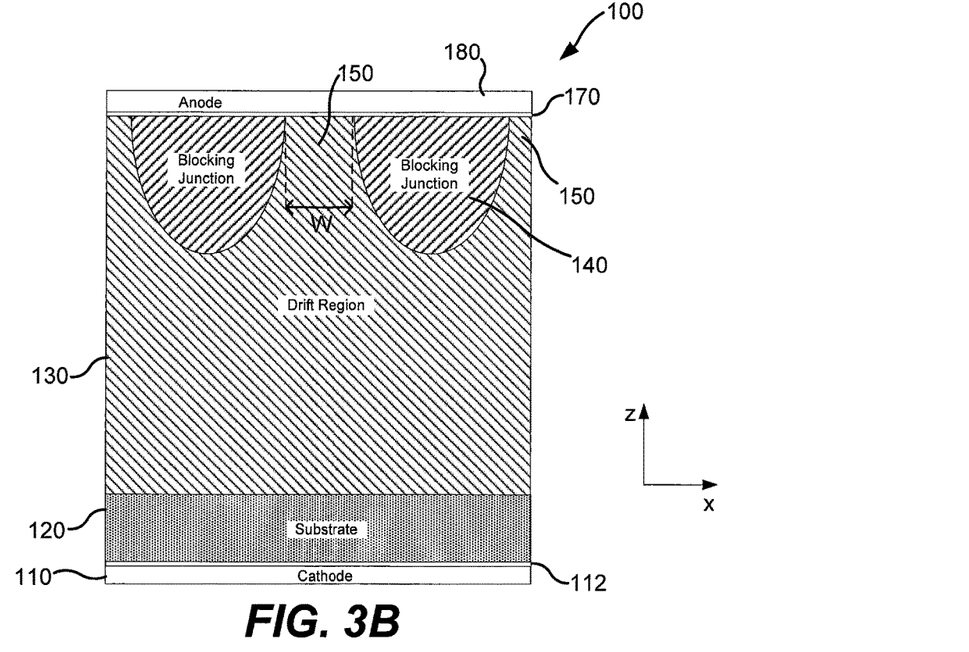
FIG. 3B is a schematic cross-sectional view taken along line 3B-3B of FIG. 3A.

FIG. 3A is a simplified schematic plan view of a power Schottky diode 100 according to embodiments of the present invention. In FIG. 3A, the topside metallization of the power Schottky diode 100 has been omitted to illustrate the locations of the channels and the blocking junctions, although a dashed line labelled 110 is included that shows the location of the periphery of the anode contact. FIG. 3B is a schematic cross-sectional view of the power Schottky diode 100 taken along line 3B-3B of FIG. 3A.

As shown in FIGS. 3A-3B, the power Schottky diode 100 includes a cathode contact 110, an ohmic contact layer 112 on the cathode contact 110, and a semiconductor substrate 120 on the ohmic contact layer 112 opposite the cathode contact 110. The illustrated device is a silicon carbide based n-type Schottky diode, so the semiconductor substrate 120 may be an n-type silicon carbide semiconductor substrate 120 that is doped with n-type dopants. An n-type silicon carbide drift region 130 may be formed via epitaxial growth on the n-type silicon carbide substrate 120. A series of p-type blocking junctions 140 are formed in the upper portion of the drift region 130. Channels 150 may be defined in the portions of the n-type drift region 130 that are between adjacent p-type blocking junctions 140. A Schottky contact 170 may be formed on top of the blocking junction 140 and the channels 150. An anode contact 180 may be formed on the Schottky contact 170 opposite the drift region 130.

In FIGS. 3A-3B, each blocking junction 140 and a channel 150 adjacent thereto may be considered to be a unit cell of the Schottky diode 100. Thus, the Schottky diode 100 depicted in FIGS. 3A-3B has approximately fifty unit cells. The cross-section of FIG. 3B illustrates approximately two of the unit cells of the Schottky diode 100 (in particular, it illustrates the blocking junctions 140 of two unit cells, the channel 150 of one unit cell and portions of the channels 150 of two other units cells).

The n-type silicon carbide semiconductor substrate 120 may comprise, for example, a 4H silicon carbide semiconductor wafer. The substrate 120 may be heavily doped with n-type impurities (i.e., an n$^+$ silicon carbide substrate). The impurities may comprise, for example, nitrogen and/or phosphorous. The doping concentration of the substrate 120 may be, for example, between $1\times10^{18}$ atoms/cm$^3$ and $1\times10^{21}$ atoms/cm$^3$. The substrate 120 may be any appropriate thickness (e.g., between 100 and 500 microns thick). The thickness of the substrate shown in FIG. 3B is not to scale to better illustrate the structure of the other layers in the power Schottky diode 100.

The n-type silicon carbide drift region 130 may be doped during growth with n-type dopants to a concentration of, for example, at least $1.5\times10^{16}$/cm$^3$. In other embodiments, the drift region 130 may be doped to a concentration of at least $2\times10^{16}$/cm$^3$, and in still other embodiments, the drift region 130 may be doped to a concentration of at least $5\times10^{16}$/cm$^3$. In example embodiments, the drift region 130 may be between 4 and 6 microns thick. The drift region 130 may be uniformly doped in some embodiments. In other embodiments, the drift region 130 may have a graded doping profile. In embodiments with uneven doping of the region 130, the higher doping concentrations may be in upper portions of the drift region 130.

The p-type blocking junctions 140 may be highly doped with p-type dopants to a concentration of at least $1\times10^{18}$/cm$^3$ in some embodiments. In other embodiments, the p-type blocking junctions 140 may be doped with p-type dopants to a concentration of at least $5\times10^{18}$/cm$^3$, and in still other embodiments, to a concentration of at least $1\times10^{19}$/cm$^3$. In example embodiments, the p-type blocking junctions 140 may be doped by ion implantation using a multi-step implantation having the implant energies and does shown in TABLE I. The ion implantation step may be performed into an exposed top surface of the drift region 130. The ion implantation may be performed at an elevated temperature of, for example, at least 300° C. In some embodiments, the elevated temperature may be at least 400° C. In still other embodiments, the elevated temperature may be at least 500° C. The high temperature implant may reduce damage to the drift region 130 caused by the high energy ion implantation.

TABLE I

| Implant Energy (keV) | P+ Implant Dose (cm$^{-2}$) |
|---|---|
| 40 | $4 \times 10^{14}$ |
| 80 | $1.5 \times 10^{15}$ |
| 180 | $8 \times 10^{14}$ |
| 320 | $6 \times 10^{14}$ |

In addition to reducing the forward voltage drop, the increased doping level of the drift region 130 also may improve the temperature coefficient of the forward voltage drop. This improvement in the temperature coefficient of the forward voltage drop may improve device performance during high temperature operation. In some embodiments, the temperature coefficient of the forward voltage drop at the rated current may be less than 0.002 V/° C. In other embodiments, the temperature coefficient of the forward voltage drop may be less than 0.003 V/° C. In still other embodiments, the temperature coefficient of the forward voltage drop may be less than 0.005 V/° C.

The ion implantation process that is used to form the p-type blocking junctions 140 may be carried out by ionizing p-type dopants and accelerating the ions in an ion implantation target chamber at a predetermined kinetic energy as an ion beam into the upper surface of the drift region 130. Based on the predetermined kinetic energy, the ionized p-type dopants may penetrate into the drift region 130 to a certain depth. In some embodiments, the blocking junctions 140 may extend to a depth of at least 1 micron from the upper surface of the drift region 130. In other embodiments, the blocking junctions 140 may extend to a depth of at least 1.2 microns, 1.5 microns or 2.0 microns from the upper surface of a drift region 130. The horizontal (lateral) width of each blocking junction 140 may be, for example, between 1.0 and 3.0 microns. In an example, embodiment, this width may be between 1.0 and 2.0 microns. Adjacent blocking junctions 140 may be laterally spaced apart from each other at distances of less than 3.0 microns to provide channels 150 having widths W of less than 3.0 microns. In further embodiments, the spacing between adjacent blocking junctions 140 (which define the channel widths) may be reduced to below 2.5 microns or even below 2.0 microns to provide channel widths W that are below 2.5 microns or 2.0 microns. In some embodiments, the channel widths may be between 2.0 and 3.0 microns. In other embodiments, the channel widths may be between 2.0 and 3.0 microns.

Figure 4:
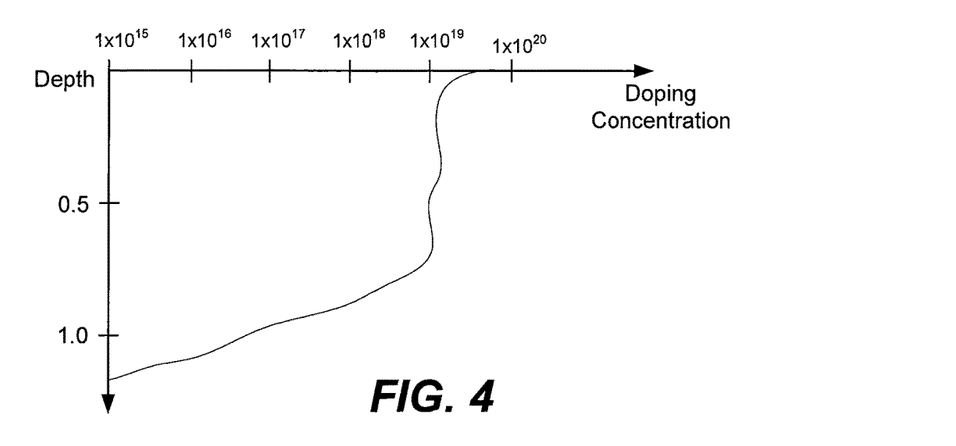
FIG. 4 is a graph that illustrates the doping concentration of the blocking junctions as a function of depth within the drift region for a power Schottky diode according to certain embodiments of the present invention.

FIG. 4 illustrates an example doping profile along a vertical centerline of one of the p-type blocking junctions of the power Schottky diode 100 of FIGS. 3A-3B. As shown in FIG. 4, the blocking junction 140 may have a p-type dopant concentration of about $1\times10^{20}$/cm$^3$ at the upper surface of the drift region 130, a p-type dopant concentration of about $1\times10^{19}$/cm$^3$ from a depth of about 0.1 microns to a depth of about 0.8 microns, and then rapidly decreasing concentrations at lower depths. For purposes of the present disclosure, the depth of the p-type blocking junction 140 is the depth at which the p-type blocking junction 140 has a doping concentration of at least $1\times10^{17}$/cm$^3$. In the example of FIG. 4, the depth of the a p-type blocking junction 140 is about 1.0 microns.

The p-type blocking junctions 140 may reduce the strength of the electric field that is formed when the Schottky diode 100 is in the reverse blocking state to help shield the Schottky contact 170 from the electric field. The channels 150 pass current in the on-state and block voltage in the reverse blocking state.

The cathode contact 110 may comprise a highly conductive metal layer such as a silver layer. In some embodiments, the cathode contact 110 may comprise a multilayer metal structure such as, for example, a Ti/Ni/Ag structure. The ohmic contact layer 112 may comprise a material that forms an ohmic contact to the substrate 120. In some embodiments, the substrate 120 may be partially or completely removed prior to formation of the ohmic contact layer 112 and the cathode contact 110.

The Schottky contact 170 may comprise a conductive layer that forms a Schottky junction with the silicon carbide drift region 130 and may comprise, for example, a titanium layer or a nickel layer. The anode contact 180 may comprise a highly conductive metal contact such as an aluminum layer.

As is shown in FIG. 3A, a plurality of guard rings 190 surround the active region of the power Schottky diode 100. The guard rings 190 may comprise p-type trench regions that are formed via ion implantation into the upper surface of the drift region 130. The guard rings 190 may surround the active region of the power Schottky diode 100. The guard rings 190 may extend into the drift region 130 to a depth that is about the same as the depth of the blocking junctions 140. The guard rings 190 may comprise edge termination structures. Other edge termination structures such as, for example, a junction termination extension may be used in place of the guard rings 190.

When the power Schottky diode 100 is operated in its reverse blocking state, leakage currents may begin to flow as the reverse voltage is increased. The leakage currents may tend to flow more heavily at the edges of the active region (i.e., the regions just within the inner guard ring 190 in FIG. 3A) because electric field crowding effects at the edge of the device may result in increased electric fields. If the reverse voltage applied to the device is increased past the reverse breakdown voltage to a critical level, the increasing electric field may result in runaway generation of charge carriers within the semiconductor device, leading to avalanche breakdown. When avalanche breakdown occurs, the current increases sharply and may become uncontrollable, and an avalanche breakdown event may damage or destroy the semiconductor device.

The guard rings 190 may reduce the above-described electric field crowding (and the resulting increased leakage currents) at the edges of the active region. The guard rings 190 (or other edge termination structure) may spread the electric field out over a greater area, thereby reducing the electric field crowding. While FIG. 3A illustrates a power semiconductor device 100 that uses two guard rings 190 as an edge termination structure, it will be appreciated that more or fewer guard rings 190 may be provided, and that any appropriate edge termination structure may be used. For example, in other embodiments, the guard rings 190 may be replaced with a junction termination extension. The edge termination structure may be omitted in some embodiments.

When the power Schottky diode 100 is operated in reverse blocking mode, a strong electric field is formed that extends upwardly from the substrate 120 throughout the drift region 130 and toward and into the channels 150. The deep blocking junctions 140 may reduce the intensity of the electric field in the upper portion of the drift region 130 during reverse blocking operation. This reduction in the electric field intensity may result in lower reverse leakage currents.

As discussed above, the size of the gap W between adjacent blocking junctions 140 (i.e., the widths of the channels 150) may be less than 3.0 microns. In other embodiments, this distance may be less than 2.5 microns or even less than 2.0 microns. In still other embodiments, the distance may be less than 1.5 microns. The reduced spacing between adjacent blocking junctions 140 may also help reduce the intensity of the electric field in the upper portion of the drift region 130 during reverse blocking operation. Once again, this reduction in the electric field intensity may result in lower reverse leakage currents.

As noted above, the reduction in the widths of the channels may tend to increase the forward operating voltage of the diode. In order to maintain the forward voltage at a desired level the doping density of the drift region 130 is increased, as discussed above. While such an increase in the doping density of the drift region (which reduces the resistance thereof) tends to increase reverse leakage currents, the deeper, more closely-spaced blocking junctions may more than compensate for this effect so that reverse leakage currents may be maintained at a desired level. It has been found that this new approach for the Schottky diode design may reduce the overall size of the Schottky diode by about 25% as compared to a convention device having the same forward voltage and reverse voltage blocking rating, and may also improve the high temperature operating characteristics of the device. In one example embodiment, Schottky diodes are provided that are 1.7×1.7 mm and thus have an area (when viewed in plan view from above) of less than 3 mm² (specifically, 1.7 mm×1.7 mm=2.89 mm²) These Schottky diodes have a reverse voltage blocking rating of 650 Volts, and a forward voltage of less than 1.7 Volts at 20 Amps forward current at temperatures between 25-175° C. The active area of the diode is 2.03 mm² and the width of the termination is 38 microns.

The power Schottky diode 100 may exhibit improved performance as compared to conventional state-of-the-art power Schottky diodes. In particular, the power Schottky diodes may have a footprint (i.e., an area when the device is viewed in plan view) that is on the order of 25-33% less than the footprint of a conventional power Schottky diode while meeting the reverse blocking voltage and forward voltage specifications. Additionally, the reduced resistivity of the drift region 130 results in an improved temperature coefficient for the forward voltage, meaning that the forward voltage for the during high temperature operation may be lower than in a conventional device. The performance of the Schottky diodes according to embodiments of the present invention also exhibit excellent high temperature performance during reverse bias operation.

FIGS. 5A-5D are schematic cross-sectional diagrams that illustrate a method of fabricating the power Schottky diode 100 according to embodiments of the present invention.

Figure 5A:
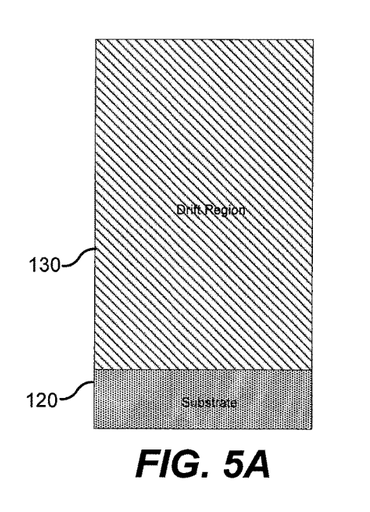
FIGS. 5A-5D are schematic cross-sectional diagrams that illustrate a method of fabricating a power Schottky diode according to embodiments of the present invention.

As shown in FIG. 5A, an n-type drift region 130 is epitaxially grown on a silicon carbide substrate 120. In some embodiments, the drift region 130 may be doped during growth with n-type impurities to a concentration of, for example, between $1.5 \times 10^{16}/cm^3$ and $1 \times 10^{17}/cm^3$. In other embodiments, the drift region 130 may be doped during growth with n-type impurities to a concentration of, for example, between $1.5 \times 10^{16}/cm^3$ and $5 \times 10^{16}/cm^3$. The drift region 130 may be uniformly doped in some embodiments. In other embodiments, the drift region 130 may have a graded doping profile, with higher doping concentrations in upper portions of the drift region 130. The drift region 130 may have a total thickness of, for example, 4-6 microns.

Figure 5B:
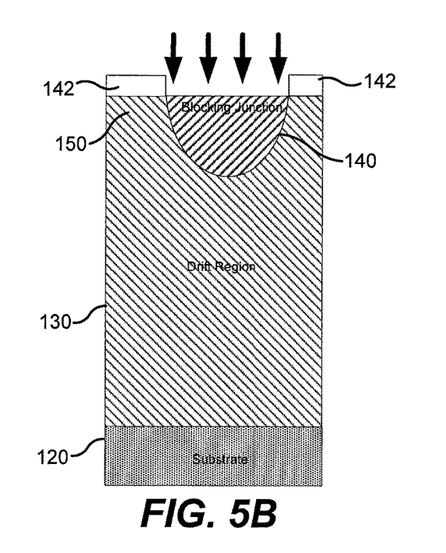

Referring to FIG. 5B, next, an ion implantation mask layer (not shown) may be formed on the drift region 130, and this mask layer may then be patterned via, for example, conventional photolithography processing steps to form an ion implantation mask pattern 142. Subsequently, p-type dopants may be implanted into the upper portions of the n-type drift region 130 that are exposed by the ion implantation mask pattern 142 in order to form the p-type blocking junctions 140. The p-type blocking junctions 140 may be highly doped with p-type dopants (e.g., to a concentration of $5 \times 10^{18}/cm^3$). The blocking junctions 140 may have a depth of, for example, about 1.0-1.5 microns in some embodiments.

Figure 5C:
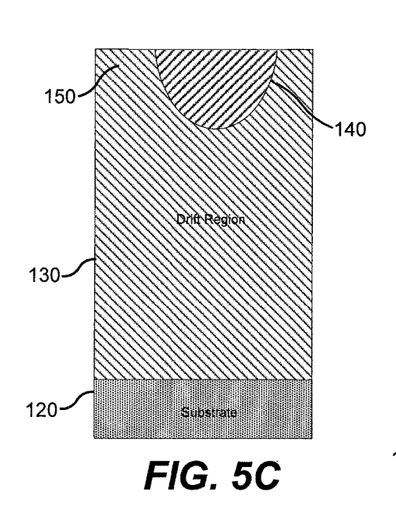
Figure 5D:
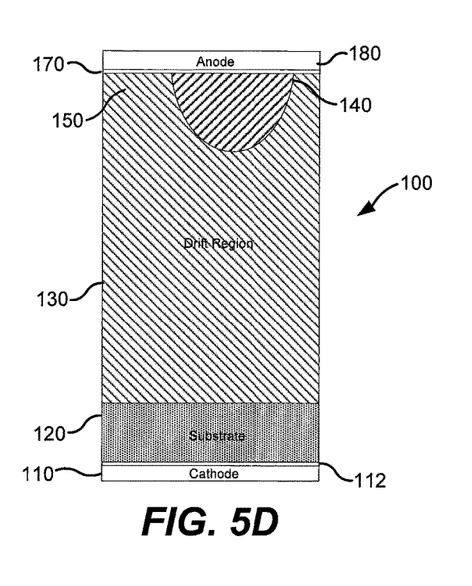

Referring to FIG. 5C, the ion implantation mask pattern 142 may then be removed. Finally, as shown in FIG. 5D, the ohmic contact layer 112, the cathode contact 110, the Schottky contact 170 and the anode contact 180 may be formed to complete the power Schottky diode 100.

Figure 6:
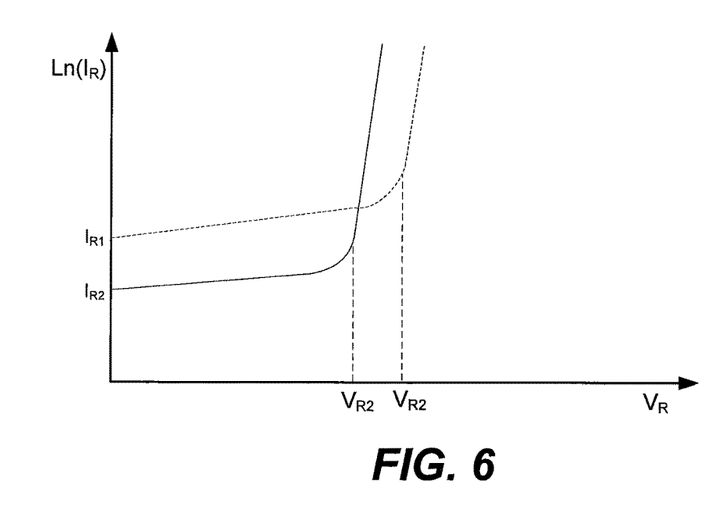
FIG. 6 is a schematic graph comparing the current-voltage characteristics of a conventional power Schottky diode during reverse bias operation to the current-voltage characteristics of a power Schottky diode according to embodiments of the present invention during reverse bias operation as a function of operating temperature.

FIG. 6 is a schematic graph illustrating the current-voltage characteristics of a conventional power Schottky diode during reverse bias operation (the dashed line) to the current-voltage characteristics of a power Schottky diode according to embodiments of the present invention during reverse bias operation (the solid line). As shown in FIG. 6, the Schottky diodes according to embodiments of the present invention may generally exhibit lower reverse leakage current levels for reverse voltages below the breakdown voltage $V_{R2}$ of the device. When the reverse breakdown voltage is reached, however, reverse leakage currents increase more rapidly than is seen in the conventional power Schottky diode. This occurs because the higher doping concentration of the thinner drift region exhibits a lower avalanche voltage.

Figure 7A:
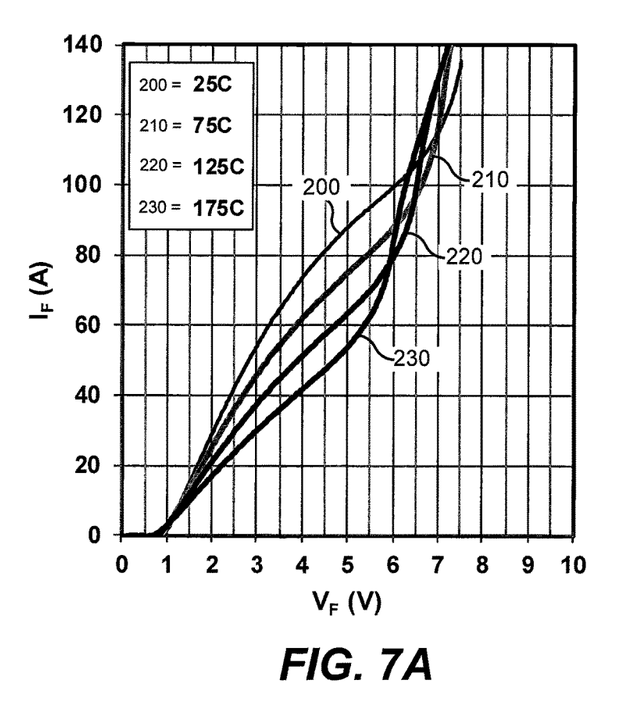
FIGS. 7A-7B are graphs that illustrate the performance of power Schottky diodes according to embodiments of the present invention during forward bias operation.
Figure 7B:
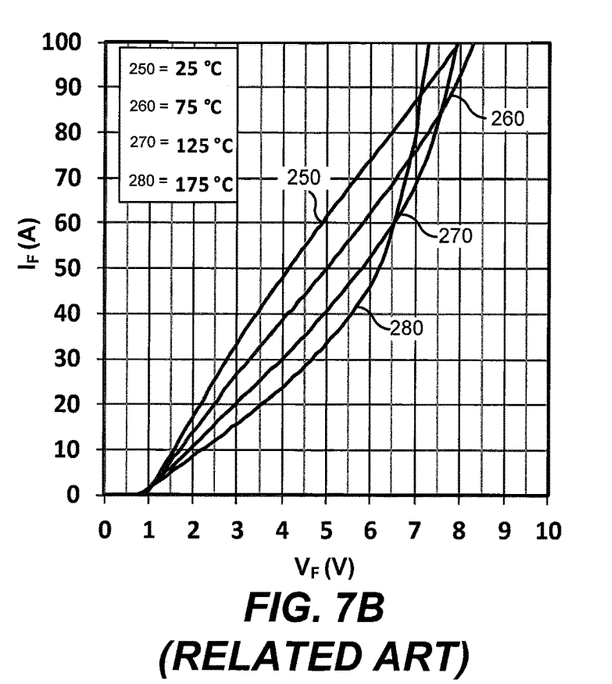

FIG. 7A illustrates the current-voltage characteristics during forward operation as a function of operating temperature for a power Schottky diode according to embodiments of the present invention. FIG. 7B illustrates the same characteristics for a state-of-the-art conventional power Schottky diode.

As shown in FIG. 7A, the power Schottky diodes exhibit forward voltage levels at forward current levels of 100 Amps of 6.5 Volts or less at all operating temperatures investigated (i.e., 25° C., 75° C., 125° C. and 175° C.). In contrast, the conventional power Schottky diode had forward voltage levels of 6.7 to 8.2 Volts at forward current levels of 100 Amps for the range of different operating temperatures investigated. This improved performance was achieved in a device that had a footprint that was 24% smaller than the conventional power Schottky diode having the performance shown in FIG. 7B.

Figure 8:
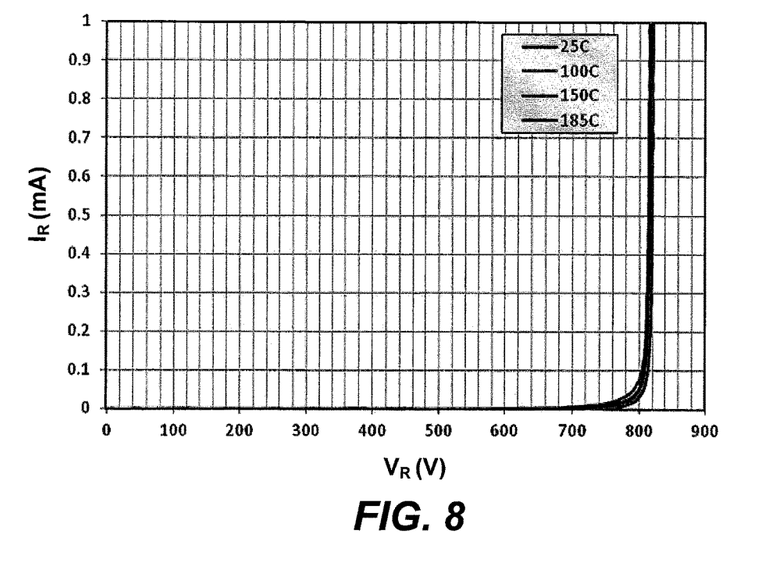
FIG. 8 is a graph that illustrates the performance of power Schottky diodes according to embodiments of the present invention during reverse bias operation as a function of operating temperature.

The power Schottky diodes according to embodiments of the present invention may also exhibit excellent performance during reverse bias operations. In particular, FIG. 8 is a graph that illustrates the performance of power Schottky diodes according to embodiments of the present invention during reverse bias operation as a function of operating temperature. As shown in FIG. 8, the reverse bias current-voltage characteristics were almost identical over a wide range of operating temperatures.

While the above embodiments of the present invention have primarily been discussed with reference to silicon carbide devices, it will be appreciated that the above techniques may also be used on other types of power Schottky diodes including power Schottky diodes fabricated in gallium nitride based materials.

While in the description above, the example embodiments are described with respect to semiconductor devices that have n-type substrates and channels in n-type portions of the drift regions, it will be appreciated that opposite conductivity type devices may be formed by simply reversing the conductivity of the n-type and p-type regions in each of the above embodiments. Thus, it will be appreciated that the present invention covers both n-type and p-type devices. Accordingly, the claims appended hereto refer to the first and second conductivity type dopants as opposed to n-type and p-type dopants.

Herein, embodiments of the present invention are typically described with respect to cross-sectional diagrams that only illustrate one or two unit cells of a power Schottky diode. It will be appreciated that some implementations will include a larger number of unit cells. However, it will also be appreciated that the present invention is not limited to such devices, and that the claims appended hereto also cover power Schottky diodes that comprise a single unit cell.

The vertical power Schottky diodes according to embodiments of the present invention have a drift region that extends vertically between cathode and anode contacts. In such devices, the lateral direction refers to the horizontal direction. Thus, the lateral width of a channel refers to the horizontal width of the channel and may be measured as the distance between sidewalls of adjacent blocking junctions.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, operations, elements, and/or components, but do not preclude the presence or addition of one or more other features, operations, elements, components, and/or groups thereof.

Relative terms such as "below" or "above" or "upper" or "lower" and the like may be used herein to describe a relationship of one element, layer or region to another element, layer or region as illustrated in the figures. It will be understood that these terms are intended to encompass different orientations of the device in addition to the orientation depicted in the figures.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Embodiments of the invention are described herein with reference to plan and cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A Schottky diode, comprising:
a drift region having an upper portion and a lower portion, the drift region doped with dopants having a first conductivity type;
a channel in the upper portion of the drift region, the channel having the first conductivity type;
a first blocking junction and a second blocking junction adjacent the first blocking junction in the upper portion of the drift region, the first and second blocking junctions defining the channel therebetween, the first and second blocking junctions doped with dopants having a second conductivity type that is opposite the first conductivity type, the first and second blocking junctions extending between 1.0 and 2.0 microns into the upper portion of the drift region and being spaced apart from each other by less than 2.0 microns;
a first contact on the upper portion of the drift region; and
a second contact on the lower portion of the drift region and vertically spaced apart from the first contact,
wherein a doping concentration of the drift region is greater than $1.5 \times 10^{16}/cm^3$.

2. The Schottky diode of claim 1, wherein first and second blocking junctions each have a depth from an upper surface of the drift region of between 1.0 microns and 1.5 microns.

3. The Schottky diode of claim 2, wherein the first and second blocking junctions each have a doping density of at least $1 \times 10^{17}/cm^3$ at a depth of 1.2 microns from the upper surface of the drift region.

4. The Schottky diode of claim 3, wherein the first and second blocking junctions are spaced apart from each other by at least 1.0 microns, and a width of each blocking junction is between 1.0 and 2.0 microns.

5. The Schottky diode of claim 1, wherein a doping concentration of the drift region is greater than $2.0 \times 10^{16}/cm^3$.

6. The Schottky diode of claim 1, wherein the drift region and the first and second blocking junctions comprise silicon carbide, and wherein a substrate is interposed between the lower portion of the drift region and the second contact.

7. The Schottky diode of claim 1, wherein the Schottky diode has an area of less than 3 $mm^2$, and a forward voltage of less than 1.7 Volts at 20 Amps forward current at temperatures between 25-175° C., and wherein a temperature coefficient of a forward voltage drop at a rated current of the Schottky diode is less than 0.003 V/° C.

8. The Schottky diode of claim 7, wherein the Schottky diode has a reverse voltage blocking rating of at least 650 Volts.

9. A Schottky diode, comprising:
a drift region having an upper portion and a lower portion, the drift region doped with dopants having a first conductivity type;
a channel in the upper portion of the drift region, the channel having the first conductivity type;
a first blocking junction and a second blocking junction adjacent the first blocking junction in the upper portion of the drift region, the first and second blocking junctions defining the channel therebetween, the first and second blocking junctions doped with dopants having a second conductivity type that is opposite the first conductivity type, the first and second blocking junctions extending between about 1.0 microns and about 1.5 microns into the upper portion of the drift region and being spaced apart from each other by between about 1.0 microns and about 3.0 microns;
a first contact on the upper portion of the drift region; and
a second contact on the lower portion of the drift region and vertically spaced apart from the first contact,
wherein a doping concentration of the drift region is between $2 \times 10^{16}/cm^3$ and $5 \times 10^{16}/cm^3$, and
wherein the Schottky diode has an area of less than 3 $mm^2$, a reverse voltage blocking rating of at least 650 Volts, and a forward voltage of less than 1.7 Volts at 20 Amps forward current at temperatures between 25-175° C.

10. The Schottky diode of claim 9, wherein the drift region and the first and second blocking junctions comprise silicon carbide, and wherein a substrate is interposed between the lower portion of the drift region and the second contact.

11. The Schottky diode of claim 10, wherein a temperature coefficient of a forward voltage drop at a rated current of the Schottky diode is less than 0.003V/° C.

12. The Schottky diode of claim 9, wherein a width of each of the first and second blocking junctions is between 1.0 microns and 2.0 microns.

13. The Schottky diode of claim 9, wherein the drift region is uniformly doped.

14. The Schottky diode of claim 9, wherein the drift region is uniformly doped and has a doping concentration that is between $1.5 \times 10^{16}/cm^3$ and $5 \times 10^{16}/cm^3$.

15. The Schottky diode of claim 1, wherein a doping concentration of the drift region is between $1.5 \times 10^{16}/cm^3$ and $5 \times 10^{16}/cm^3$.

16. The Schottky diode of claim 1, wherein the drift region is uniformly doped.

17. The Schottky diode of claim 1, wherein the drift region is uniformly doped and has a doping concentration that is between $1.5 \times 10^{16}/cm^3$ and $5 \times 10^{16}/cm^3$.

* * * * *

UNITED STATES PATENT AND TRADEMARK OFFICE
CERTIFICATE OF CORRECTION

PATENT NO. : 10,510,905 B2
APPLICATION NO. : 15/642634
DATED : December 17, 2019
INVENTOR(S) : Zhang et al.

Page 1 of 1

It is certified that error appears in the above-identified patent and that said Letters Patent is hereby corrected as shown below:

In the Specification

Column 4, Line 50: Please correct "$Y_{F1}$" to read -- $V_{F1}$ --

Signed and Sealed this
Seventeenth Day of March, 2020

Andrei Iancu
*Director of the United States Patent and Trademark Office*